(12) United States Patent
Yen et al.

(10) Patent No.: US 9,978,634 B2
(45) Date of Patent: May 22, 2018

(54) METHOD FOR FABRICATING SHALLOW TRENCH ISOLATION AND SEMICONDUCTOR STRUCTURE USING THE SAME

(71) Applicant: TAIWAN SEMICONDUCTOR MANUFACTURING CO., LTD., Hsinchu (TW)

(72) Inventors: Chun-Hsu Yen, Hsinchu (TW); Bang-Yu Huang, Zhubei (TW); Chui-Ya Peng, Hsinchu (TW); Ching-Wen Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 14/632,690

(22) Filed: Feb. 26, 2015

(65) Prior Publication Data
US 2016/0254179 A1 Sep. 1, 2016

(51) Int. Cl.
*H01L 21/762* (2006.01)
*H01L 21/02* (2006.01)
*H01L 29/06* (2006.01)
*H01L 21/3105* (2006.01)
*C23C 16/04* (2006.01)
*C23C 16/505* (2006.01)

(52) U.S. Cl.
CPC ...... *H01L 21/76224* (2013.01); *C23C 16/045* (2013.01); *C23C 16/505* (2013.01); *H01L 21/02164* (2013.01); *H01L 21/02211* (2013.01); *H01L 21/02274* (2013.01); *H01L 21/31053* (2013.01); *H01L 21/31056* (2013.01); *H01L 21/76229* (2013.01); *H01L 29/0649* (2013.01)

(58) Field of Classification Search
None
See application file for complete search history.

(56) References Cited

U.S. PATENT DOCUMENTS

| | | | | |
|---|---|---|---|---|
| 5,182,221 A | * | 1/1993 | Sato | H01L 21/02164 148/DIG. 118 |
| 5,930,644 A | * | 7/1999 | Tsai | H01L 21/31053 257/E21.244 |
| 7,682,927 B2 | * | 3/2010 | Hoshi | H01L 21/02126 257/E21.546 |
| 9,224,634 B2 | * | 12/2015 | Sonsky | H01L 21/76264 |
| 2006/0102977 A1 | * | 5/2006 | Fucsko | H01L 21/316 257/499 |
| 2011/0049669 A1 | * | 3/2011 | Lee | H01L 21/76232 257/510 |
| 2012/0282756 A1 | * | 11/2012 | Meng | C23C 16/045 438/435 |

(Continued)

*Primary Examiner* — Ali Naraghi
(74) *Attorney, Agent, or Firm* — Maschoff Brennan (57) ABSTRACT

A method for fabricating a shallow trench isolation includes forming a trench in a substrate, forming a bottom shallow trench isolation dielectric filling a gap of the trench, and forming a top shallow trench isolation dielectric on the bottom shallow trench isolation. The bottom shallow trench isolation dielectric has a concave center portion, and the top shallow trench isolation dielectric is deposited on the bottom shallow trench isolation by a high density plasma chemical vapor deposition process using low deposition to sputter ratio. A semiconductor structure having the shallow trench isolation is also disclosed.

20 Claims, 10 Drawing Sheets

(56) References Cited

U.S. PATENT DOCUMENTS

2015/0004773 A1* 1/2015 Deng ................ H01L 21/76229
  438/424
2015/0102453 A1* 4/2015 Cai .................. H01L 21/76224
  257/506

* cited by examiner

METHOD FOR FABRICATING SHALLOW TRENCH ISOLATION AND SEMICONDUCTOR STRUCTURE USING THE SAME

BACKGROUND

Many processes in the fabrication of integrated circuits require the formation of variously shaped trenches in the substrate and their subsequent filling. For example, the fabrication of DRAM circuits requires dielectric filled trenches for the formation of storage capacitors. There are also a wide variety of circuit topologies (including DRAM circuits) that require portions of the circuit to be isolated from each other by shallow trench isolation (STI).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A to FIG. 1H are cross-sectional views of different steps of a method for fabricating a shallow trench isolation (STI), in accordance with some embodiments

FIG. 4A to FIG. 4G are cross-sectional views of different steps of a method for fabricating a shallow trench isolation (STI), in accordance with some embodiment.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Shallow trench isolation (STI) is commonly used in the semiconductor art for forming isolations between active device areas in an integrated circuit. The rough surface of the shallow trench isolation induces defects such as photoresist deformation, and that may occur more defects in the following processes. Planarization to the shallow trench isolation, for example by using a sputter back process is commonly performed after the shallow trench isolation is formed. However, the sputter back process causes extra device leakage in some cases. The process of sputtering back shallow trench isolation not only causes loss of wafer throughput, but also consumes lots of time. Furthermore, particles are generated during the sputter back process, such that subsequent cleaning steps are needed to prevent the wafer from being polluted by the particles. Therefore, the present disclosure provides a method for forming a shallow trench isolation by using two-step trench filling technique, thus the extra step of surface planarization can be omitted.

With reference to FIG. 1A to FIG. 1H, which are cross-sectional views of different steps of a method for fabricating a shallow trench isolation (STI), in accordance with some embodiments, in portion or entirety, during various fabrication steps of the method. It is understood that additional steps can be provided before, during, and after the method, and some of the steps described below can be replaced or eliminated, for additional embodiments of the method.

Figure 1A:
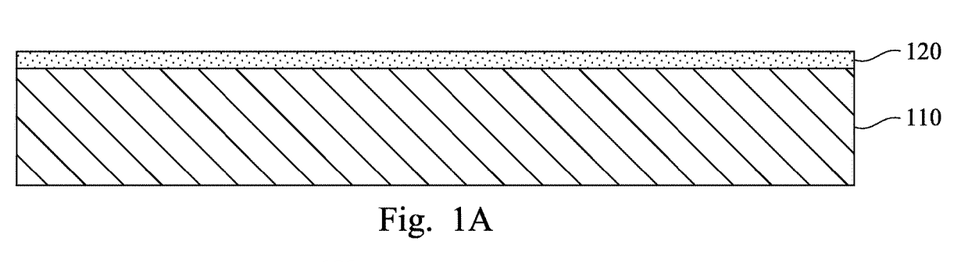

Referring to FIG. 1A, a pad layer 120 is formed on the entire surface of a substrate 110. The pad layer 120 may be formed on the substrate in any suitable manner, such as by chemical vapor deposition (CVD), physical vapor deposition (PVD), or the like. The substrate 110 is made of, for example, silicon; a compound semiconductor, such as silicon carbide, indium arsenide, or indium phosphide; or an alloy semiconductor, such as silicon germanium carbide, gallium arsenic phosphide, or gallium indium phosphide. The pad layer 120 may have a dielectric constant greater than about 3.5. The pad layer 120 is made of, for example, silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide ($SiO_2$). In some embodiments, the pad layer 120 includes a pad oxide layer and a pad nitride layer. The pad layer 120 is formed by, for example low-pressure chemical vapor deposition (LPCVD).

Figure 1B:
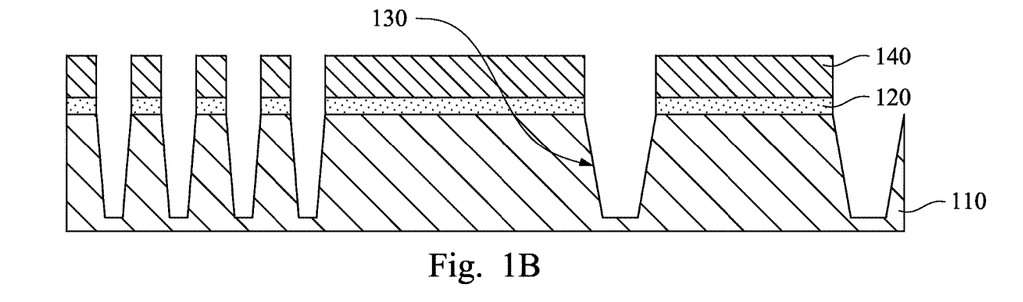

Referring to FIG. 1B, a plurality of trenches 130 are formed. In order to form the trenches 130, a mask layer 140 is formed on the substrate 110. The mask layer 140 is a photoresist layer. The mask layer 140 is patterned by a lithography process to form a plurality of features and a plurality of openings defined by the features on the pad layer 120. The pattern of the mask layer 140 is formed according to a predetermined integrated circuit pattern. Then, an etching process is performed to form the trenches 130. The patterned mask layer 140 is removed after this step.

Figure 1C:
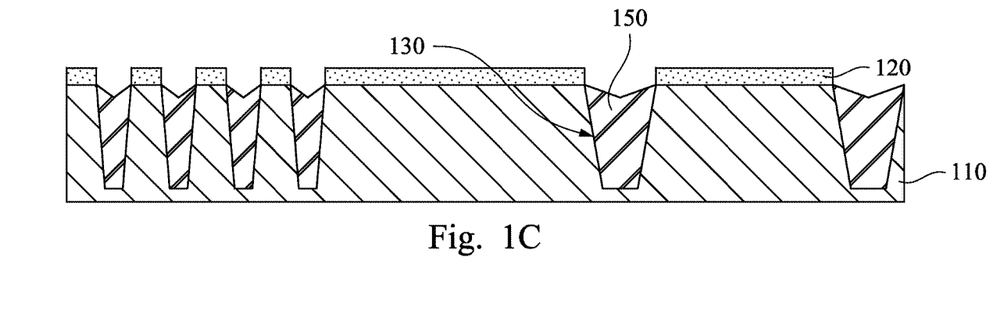

Referring to FIG. 1C, a bottom shallow trench isolation dielectric 150 is filled in the trenches 130. The bottom shallow trench isolation dielectric 150 is made of, for example, oxide. The bottom shallow trench isolation dielectric 150 is deposited in the trenches 130 and does not cover the pad layer 120. Because the opening diameter at the top of the trench 130 is greater than the opening diameter at the bottom of the trench 130, therefore the surface of the bottom shallow trench isolation dielectric 150 in each of the trenches 130 is concave.

Figure 1D:
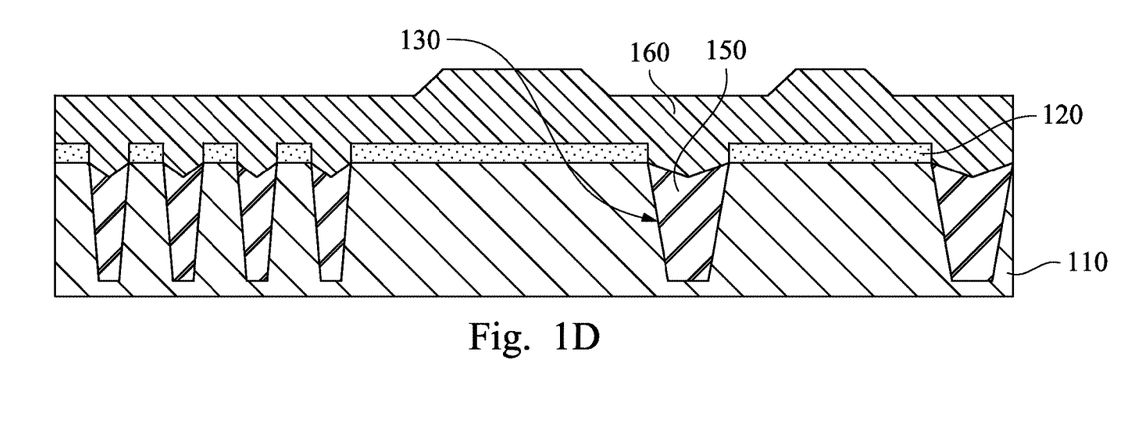

Referring to FIG. 1D, a top shallow trench isolation dielectric 160 is formed on the substrate 110. The top shallow trench isolation dielectric 160 covers the pad layer 120 and the bottom shallow trench isolation dielectric 150. The top shallow trench isolation dielectric 160 is an oxide layer. The thickness of the top shallow trench isolation dielectric 160 is thinner than the thickness of the bottom shallow trench isolation dielectric 150.

The bottom shallow trench isolation dielectric 150 and the top shallow trench isolation dielectric 160 are formed on the substrate 110 by a chemical vapor deposition process. The bottom shallow trench isolation dielectric 150 and the top shallow trench isolation dielectric 160 are two-step formed on the substrate 110. In some embodiments, the bottom shallow trench isolation dielectric 150 and the top shallow trench isolation dielectric 160 are formed in the same process chamber. For example, the bottom shallow trench isolation dielectric 150 and the top shallow trench isolation dielectric 160 are formed by a high density plasma chemical vapor deposition process (HDP-CVD) to prevent the production of voids due to its good ability in filling the gap. The HDP-CVD is the method of chemical vapor deposition that is able to execute the depositing and sputtering process in the meantime. The HDP-CVD ions have a deposition component and a sputter component, such that the deposition and sputter-back step are performed in-situ, at one single process chamber as one step in the HDP-CVD process. Good gap filling performance, high film density and less metal contamination have qualified HDP-CVD for shallow trench isolation application without post deposition anneal.

In some embodiments, the recipe of the bottom shallow trench isolation dielectric 150 and the top shallow trench isolation dielectric 160 are substantially the same, but the ratio of the deposition reactants utilized in the bottom shallow trench isolation dielectric 150 and the top shallow trench isolation dielectric 160 are different. In some embodiments, the reactant gasses utilized in oxide deposition include silane ($SiH_4$) and oxygen ($O_2$), and the silicon oxide is filled in the trench 130. The ratio of the $SiH_4$ to $O_2$ introduced to the process chamber can be adjusted. The ratio of the $SiH_4$ to $O_2$ introduced into the process chamber when the bottom shallow trench isolation dielectric 150 is formed is different from that when the top shallow trench isolation dielectric 160 is formed. For example, the ratio of the $SiH_4$ to $O_2$ for forming the bottom shallow trench isolation dielectric 150 is greater than the ratio of the $SiH_4$ to $O_2$ for forming the top shallow trench isolation dielectric 160. Namely, the silicon oxide ($Si_xO_y$) in the bottom shallow trench isolation dielectric 150 has more silicon and less oxygen (x>y), and the silicon oxide ($Si_xO_y$) in the top shallow trench isolation dielectric 160 has less silicon and more oxygen (x<y). Thus the bottom shallow trench isolation dielectric 150 and the top shallow trench isolation dielectric 160 have different index of reflectance. In some embodiments, the bottom shallow trench isolation dielectric 150 is a silicon-richer layer since the top shallow trench isolation dielectric 160 is an oxygen-richer layer, the index of reflectance of the top shallow trench isolation dielectric 160 is in a range from about 1.454 to about 1.456, and the index of reflectance of the bottom shallow trench isolation dielectric 150 is in a range from about 1.458 to about 1.460. Alternatively, suitable dopants can be introduced into the process chamber. The deposition reactants can use other suitable gases for oxide deposition.

The bottom shallow trench isolation dielectric 150 is deposited in the trenches 130 in the gap filling step. In this step, the reactant gases includes deposition gases, such as $SiH_4$ and $O_2$, thereby depositing the bottom shallow trench isolation dielectric 150 made of silicon nitride filling the trenches 130. The process of depositing the bottom shallow trench isolation dielectric 150 is stopped at when the bottom shallow trench isolation dielectric 150 fills the trenches 130, such that the bottom shallow trench isolation dielectric 150 does not cover the pad layer 120.

The top shallow trench isolation dielectric 160 is deposited on the substrate 110 after the trenches 130 are filled with the bottom shallow trench isolation dielectric 150. The top shallow trench isolation dielectric 160 covers the bottom shallow trench isolation dielectric 150 and the pad layer 120. The sputter reactant is introduced into the process chamber with the deposition reactant when the top shallow trench isolation dielectric 160 is formed. The sputter reactant can be gas, such as argon (Ar), oxygen ($O_2$), or hydrogen ($H_2$). While the silicon oxide film is deposited through plasma enhanced reaction, the sputter reactant, such as Ar ions, $O_2$ ions or $H_2$ ions, are also formed inside the plasma and directed to the substrate 110 via bias RF power. The resulting high energy sputter ions bombardment causes physical sputtering of the deposited silicon oxide film. Since the degree of sputtering is controlled by both ion density and ion energy, desired sputter rate can be achieved by using HDP-CVD. The deposition to sputter ratio can be adjusted by varying the process controlling parameter for achieving desired filling performance.

The HDP-CVD process uses low deposition to sputter ratio for depositing the top shallow trench isolation dielectric 160. However, if the deposition to sputter ratio is too low, the top shallow trench isolation dielectric 160 cannot be deposited on the bottom shallow trench isolation dielectric 150 successfully. If the deposition to sputter ratio is too high, the surface of the top shallow trench isolation dielectric 160 becomes too rough. In some embodiments, the deposition to sputter ratio in the top shallow trench isolation dielectric 160 is in a range from about 1.2 to about 3.0. Thus the top shallow trench isolation dielectric 160 can be deposited on the bottom shallow trench isolation dielectric 150 and the pad layer 120 successfully and has a smooth top surface.

The bottom shallow trench isolation dielectric 150 is utilized for filling the trenches 130, and the top shallow trench isolation dielectric 160 is utilized for top profile repairing. The top shallow trench isolation dielectric 160 is thinner than the bottom shallow trench isolation dielectric 150, so that the in-situ deposition and sputter process to form the top shallow trench isolation dielectric 160 does not result in loss of throughput.

In some embodiments, the thickness from the bottom surface of the substrate 110 to the top surface of the top shallow trench isolation dielectric 160 is about 680 nm, in which the thickness of the top shallow trench isolation dielectric 160 is in a range from about 45 nm to about 210 nm. The thickness of the top shallow trench isolation dielectric 160 is thinner than the depth of the trench 130, such that when the top shallow trench isolation dielectric 160 is formed in the in-situ HDP-CVD process, which provides both deposition and sputter function, the fabricating time can be shortened and the throughput loss is reduced.

Figure 1E:
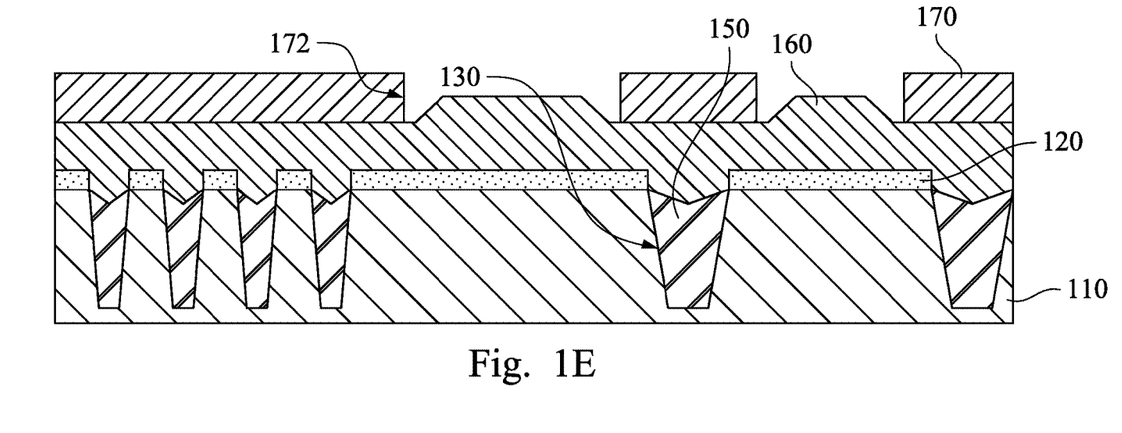

Referring to FIG. 1E, a mask layer 170 is formed on the top shallow trench isolation dielectric 160. The mask layer 170 is a photoresist layer having etching mask pattern. The mask layer 170 is formed to expose the photoresist layer which has been processed by conventional photolithographic methods as are known in the art of microelectronics fabrication to produce the etching mask pattern. The pattern of the mask layer 170 is incorporated into its design a dimensional bias to produce the exposed pattern opening 172 in the mask layer 170 to protect the edges of the trenches 130 during subsequent processing steps. Namely, the trenches 130 are covered and protected by the mask layer 160. The profile of the top shallow trench isolation dielectric 160 is controlled to fit the pattern of the mask layer 170 by adjusting the ion density and the ion energy during the HDP-CVD process. For example, the area with flattened surface of the top shallow trench isolation dielectric 160 for being placing the patterned mask layer 170 thereon is larger than the patterned mask layer 170 itself, such that the mask layer 170 would not be deformed. The top surface of the top shallow trench isolation dielectric 160 is smooth because the top shallow trench isolation dielectric 160 has a thin thickness and is deposited by the HDP-CVD process.

Figure 1F:
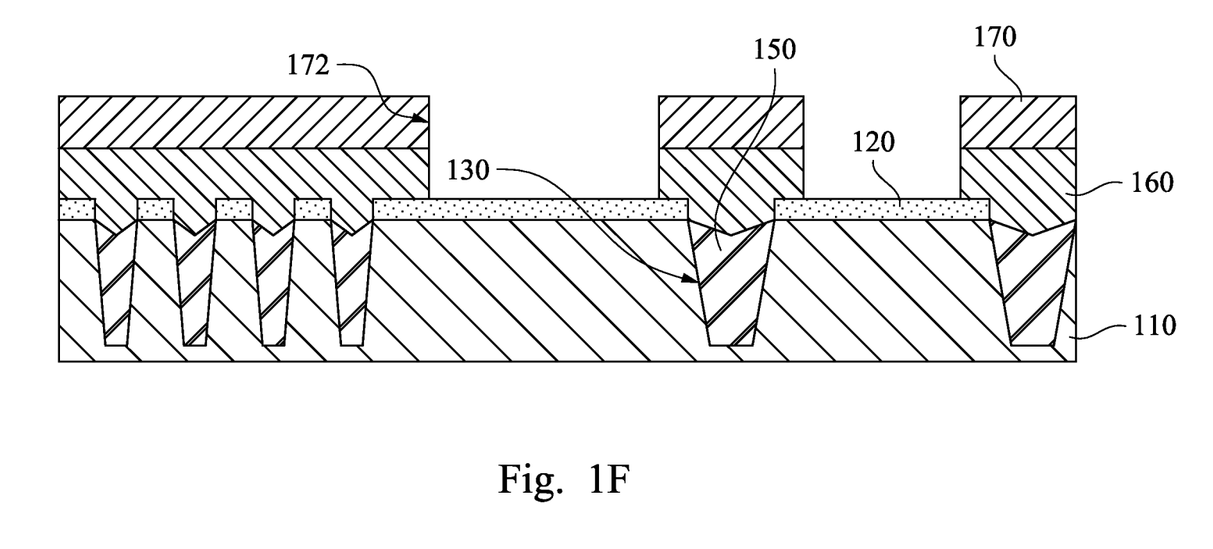

Referring to FIG. 1F, the exposed portion of the top shallow trench isolation dielectric 160, which is exposed of the openings 172 and is uncovered by the mask layer 170 is removed. The exposed top shallow trench isolation dielectric 160 is removed by, for example an etching process. The step for etching the exposed portion of the top shallow trench isolation dielectric 160 is stopped at reaching the pad layer 120. Therefore, the portion of the pad layer 120 uncovered by the mask layer 170 is also exposed from the openings 172. The mask layer 170 is removed after this step.

Figure 1G:
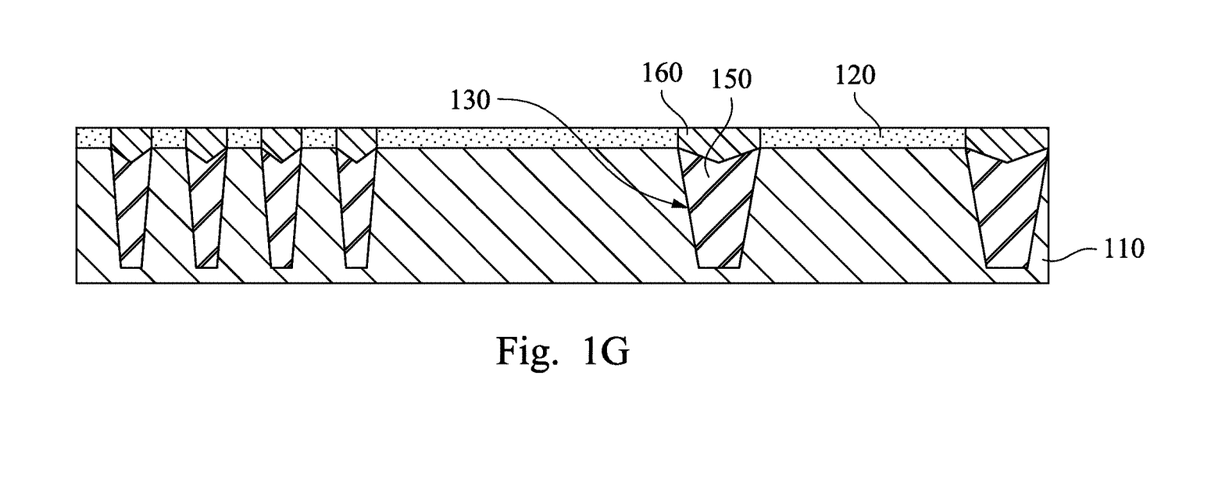

Referring to FIG. 1G, a planarization process is performed after the mask layer is removed. The planarization process can be a chemical mechanical polishing (CMP) process. The substrate 110 is transferred to a CMP station for being polished. The substrate 110 is rinsed after being polished. Therefore, the surface of the substrate 110 is clean and planarized. The step of polishing the substrate 110 is stop at reaching the pad layer 120. Namely, the portion of the top shallow trench isolation dielectric 160 over the pad layer 120 is removed.

Figure 1H:
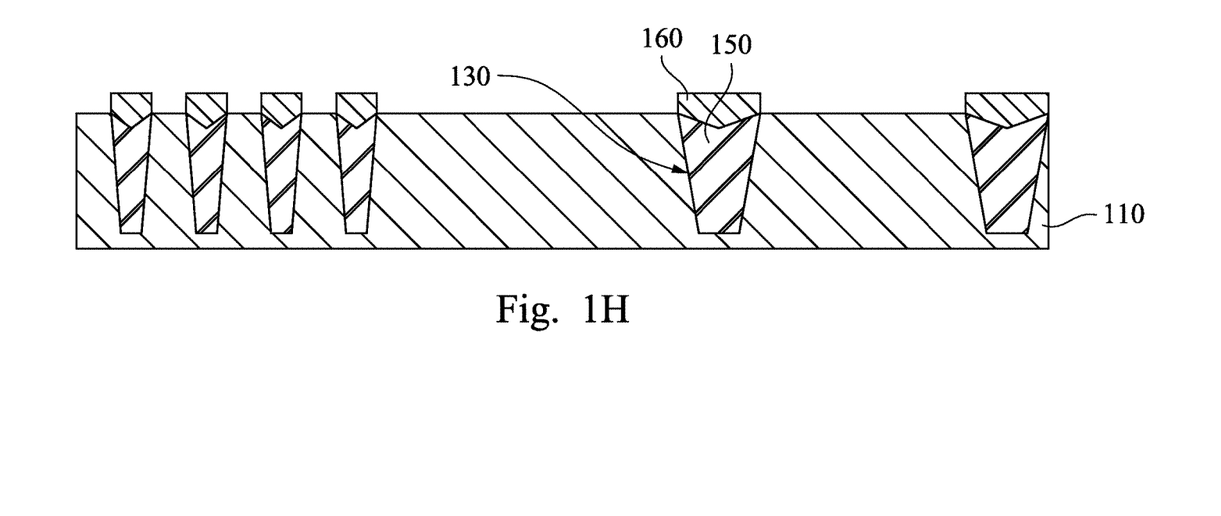

Referring to FIG. 1H, the remained pad layer 120 (see FIG. 1G) is removed from the substrate 110. The pad layer 120 can be removed by acidic component having high selectivity between the pad layer 120 and the substrate 110. The acidic component can include organic acid, such as benzenedicarboxylic acid, naphthalenedicarboxylic acid, benzenetricarboxylic acid, naphthalenetricarboxylic acid, pyridinedicarboxylic acid, bipyridyldicarboxylic acid, formic acid, oxalic acid, malonic acid, succinic acid, glutaric acid, hexanedioic acid, heptanedioic acid and cyclohexyldicarboxylic acid, etc. The acidic component can include inorganic acid, such as HF, HCl, HBr, HI, $HNO_3$, $H_3PO_4$, $H_2SO_4$, $HClO_4$, or a mixture thereof.

Therefore, the shallow trench isolations including the trench 130, the bottom shallow trench isolation dielectric 150 and the top shallow trench isolation dielectric 160 are formed in the substrate 110. The remained top shallow trench isolation dielectric 120 is in a range from about 1 nm to about 12 nm. The thickness of the top shallow trench isolation dielectric 160 is thin, such that when the top shallow trench isolation dielectric 160 is formed in the in-situ HDP-CVD process, which provides both deposition and sputter function, the fabricating time can be shortened and the throughput loss is reduced.

Figure 2:
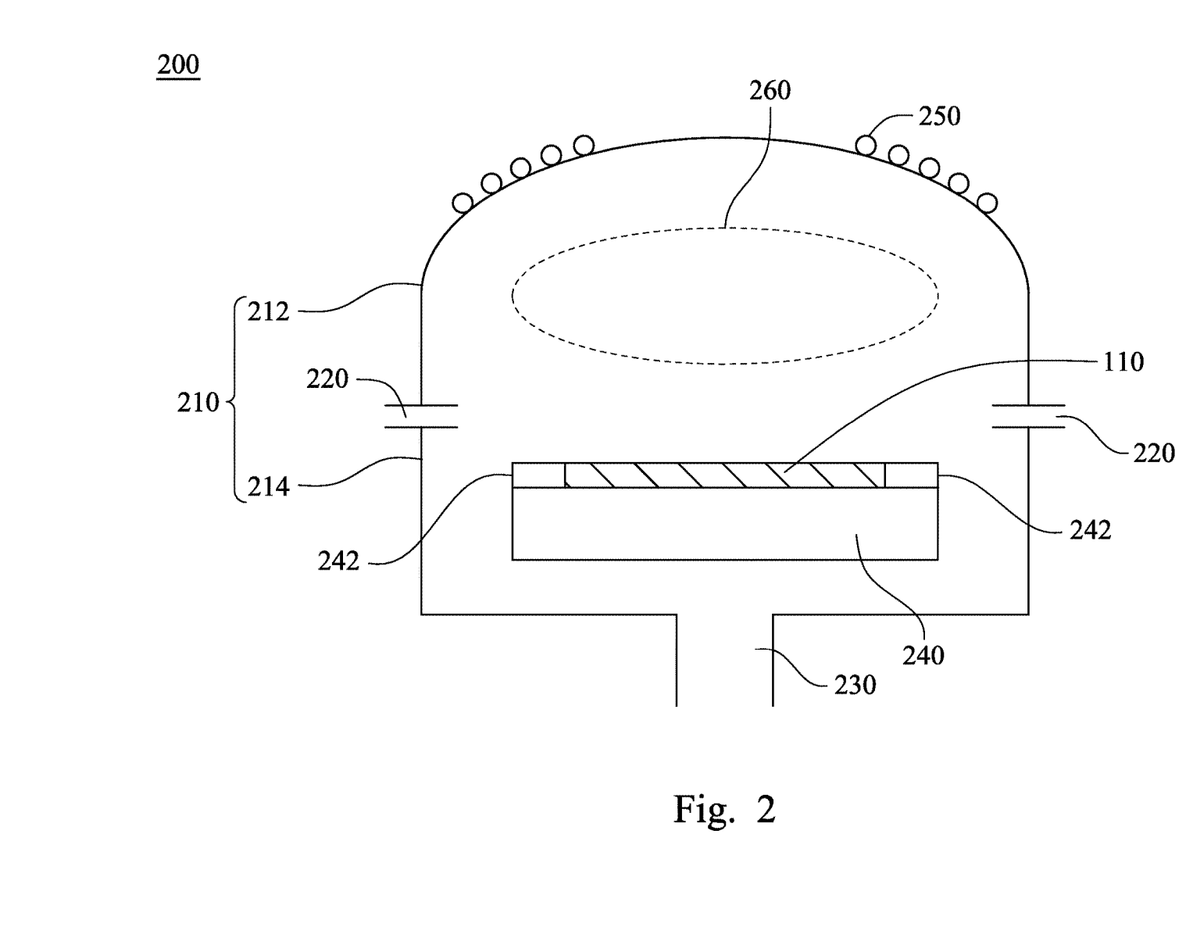
FIG. 2 is a schematic view of a HDP-CVD apparatus, in accordance with some embodiments.

Referring to FIG. 2, which shows a schematic view of a HDP-CVD apparatus, in accordance with some embodiments. The HDP-CVD apparatus 200 includes a chamber 210. The chamber 210 includes an upper container 212 and a lower container 214. In some embodiments, the upper container 212 is made of quartz and formed in a dome shape. The chamber 210 includes at least one gas inlet 220 for introducing reactant gasses into the chamber 210. The reactant gasses include the deposition gas, such as silane ($SiH_4$) and oxygen ($O_2$), and the sputter gas, such as $O_2$, argon (Ar), or hydrogen ($H_2$). The chamber 210 includes a gas outlet 230 led to a vacuum pump for generating a vacuum environment in the chamber 210.

The HDP-CVD apparatus 200 includes a holder 240 installed in the chamber 210, and the substrate 110 is fastened on the upper surface of the holder 240. The chunk 242 is installed at a periphery of the substrate 110 to prevent the substrate 110 from moving on the upper surface of the holder 240. A coil antenna 250 is installed at the outer wall of the upper container 212 to receive an RF power from an RF generator (not shown). When an RF power of a single frequency band or an RF power of various frequency bands is applied to the coil antenna 250, a high density plasma 260 is formed above the substrate 110 within the chamber 210.

Since both the RF power and the ratio of the deposition reactants and the sputter reactant can be adjusted, the deposition to sputter ratio can be controlled during the HDP-CVD process. In some embodiments, the step of filling the trench in the shallow trench isolation shown in FIG. 1H can be fabricated within the single HDP-CVD apparatus 200 by adjusting the ratio of the reactant and the RF power thereof.

Reference is made to both FIG. 1C, FIG. 1D, and FIG. 2, in the gap-filling step shown in FIG. 1C, the bottom shallow trench isolation dielectric 150 is deposited and fills the trench 130. Then the top shallow trench isolation dielectric 160 is deposited on the bottom shallow trench isolation dielectric 150 shown in FIG. 1D. The deposition reactants utilized for forming the bottom shallow trench isolation dielectric 150 and the top shallow trench isolation dielectric 160 are substantially the same but with different ratio. For example, in the step of forming the bottom shallow trench isolation dielectric 150, the silane gas is more than oxygen gas; in the step of forming the top shallow trench isolation dielectric 160, the oxygen gas is more than the silane gas. The deposition to sputter ratio of forming the top shallow trench isolation dielectric 160 is in a range from about 1.2 to about 3.0. Thus the top shallow trench isolation dielectric 160 can be deposited on the bottom shallow trench isolation dielectric 150 and the pad layer 120 successfully and has a smooth top surface.

Figure 3:
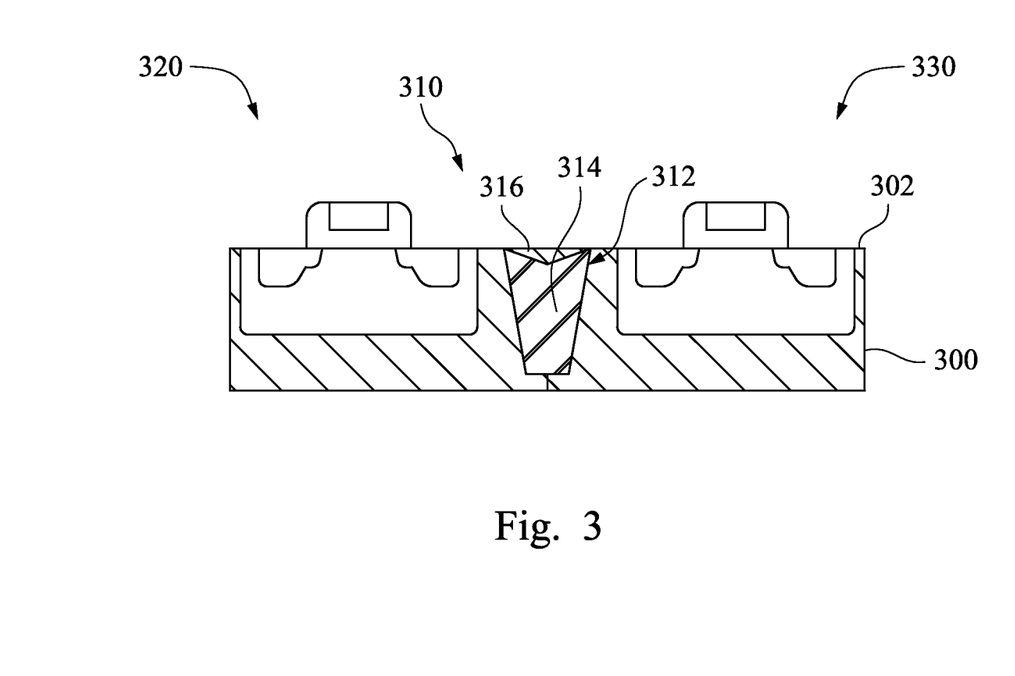
FIG. 3 is a schematic cross-sectional view of a semiconductor structure having a shallow trench isolation, in accordance with some embodiments.

Referring to FIG. 3, which is a schematic cross-sectional view of a semiconductor structure having a shallow trench isolation, in accordance with some embodiments. The shallow trench isolation 310 is widely used for forming isolation between active areas in the integrated circuits. For example, the shallow trench isolation 310 is utilized for isolating transistors 320, 330. In some embodiments, the shallow trench isolation 310 is utilized for isolating transistors and other semiconductor components. The shallow trench isolation 310 includes a trench 312 formed between the transistors 320, 330, a bottom shallow trench isolation dielectric 314 and top shallow trench isolation dielectric 316 filling the trench 312. The bottom shallow trench isolation dielectric 314 and the top shallow trench isolation dielectric 316 are two-step formed, in which the bottom shallow trench isolation dielectric 314 is formed to fill the gap of the trench 312, and the top shallow trench isolation dielectric 316 is formed to repair the profile of the top surface of the shallow trench isolation 310. The bottom shallow trench isolation dielectric 314 is deposited for filling the gap of the trench 312, and the bottom shallow trench isolation dielectric 314 does not cover the top surface 302 of the substrate 300. The trench 312 has a wider opening at the top and has a narrower opening at the bottom, such that the bottom shallow trench isolation dielectric 314 has a concave center portion. When the top shallow trench isolation dielectric 316 is deposited on the substrate 300, the top shallow trench isolation dielectric 316 fills the cavity above the concave center portion. The top shallow trench isolation dielectric 316 is deposited by the HDP-CVD process, which provides both deposition and sputter function, such that the profile of the top shallow trench isolation dielectric 316 can be adjusted. In some embodiments, the top shallow trench isolation dielectric 316 is formed by a low deposition to sputter ratio HDP-CVD process, in which the deposition to sputter ratio is in a range from about 1.2 to about 3.0, such that the top shallow trench isolation dielectric 316 can be deposited on the bottom shallow trench isolation dielectric 314 successfully and has a smooth top surface. The thickness of the top shallow trench isolation dielectric 316 is thinner than the depth of the trench 312, such that the time for depositing the top shallow trench isolation dielectric 316 can be saved and the throughput thereof can be reduced. The smooth surface of the top shallow trench isolation dielectric 316 allows the step of forming the mask layer thereon prevent from deformation. The portion of the top shallow trench isolation dielectric 316 protruded from the top surface 302 of the substrate 300 can be removed during the steps of forming transistors 320, 330. Therefore, only little amount of top shallow trench isolation dielectric 316 still remains in the trench 312. In some embodiments, the thickness of the remained top shallow trench isolation dielectric 316 is in a range from about 10 angstrom to about 120 angstrom. The bottom shallow trench isolation dielectric 314 and the top shallow trench isolation dielectric 316 are deposited by substantially the same reactants but in different ratios. In some embodiments, the bottom shallow trench isolation dielectric 314 is a silicon-richer layer since the top shallow trench isolation dielectric 316 is an oxygen-richer layer, the index of reflectance of the top shallow trench isolation dielectric 316 is in a range from about 1.454 to about 1.456, and the index of reflectance of the bottom shallow trench isolation dielectric 314 is in a range from about 1.458 to about 1.460.

Reference is made to FIG. 4A to FIG. 4G, which are cross-sectional views of different steps of a method for fabricating a shallow trench isolation (STI), in accordance with some embodiments, in portion or entirety, during various fabrication steps of the method. It is understood that additional steps can be provided before, during, and after the method, and some of the steps described below can be replaced or eliminated, for additional embodiments of the method.

Figure 4A:
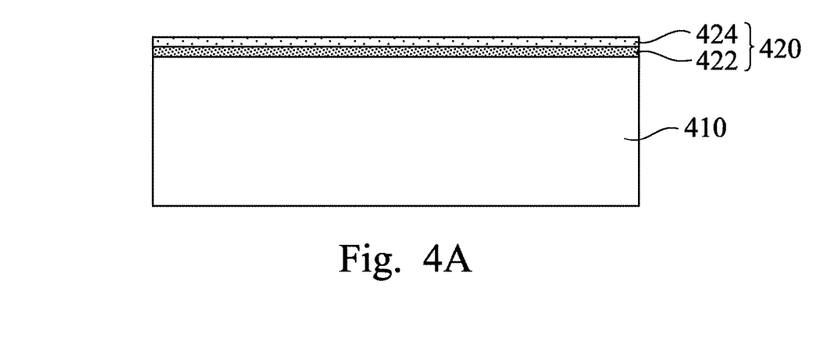

Referring to FIG. 4A, a pad layer 420 is formed on the entire surface of a substrate 410. The pad layer 420 may be formed on the substrate in any suitable manner, such as by chemical vapor deposition (CVD), physical vapor deposition (PVD), or the like. The substrate 410 is made of, for example, silicon; a compound semiconductor, such as silicon carbide, indium arsenide, or indium phosphide; or an alloy semiconductor, such as silicon germanium carbide, gallium arsenic phosphide, or gallium indium phosphide. The pad layer 420 may have a dielectric constant greater than about 3.5. The pad layer 420 is made of, for example, silicon nitride (SiN), silicon carbide (SiC), nitrogen-doped silicon carbide (SiC:N, also known as NDC), silicon oxynitride (SiON), oxygen-doped silicon carbide (SiC:O, also known as ODC), or silicon oxide ($SiO_2$). In some embodiments, the pad layer 420 includes a pad oxide layer 422 and a pad nitride layer 424.

Figure 4B:
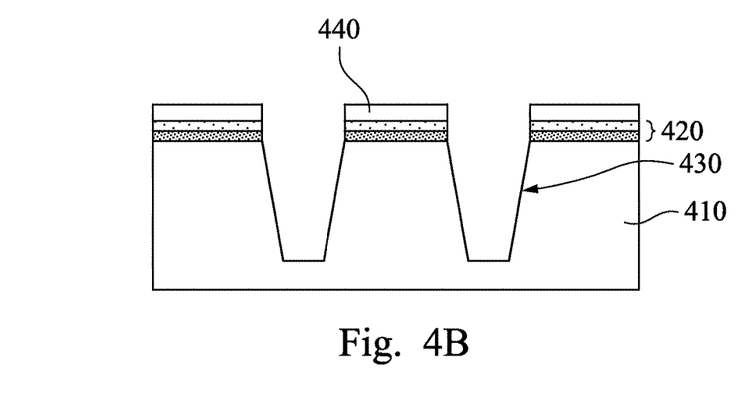

Referring to FIG. 4B, a plurality of trenches 430 are formed. In order to form the trenches 430, a mask layer 440 is formed on the substrate 410. The mask layer 440 is a photoresist layer. The mask layer 440 is patterned by a lithography process to form a plurality of features and a plurality of openings defined by the features on the pad layer 420. Then, an etching process is performed to form the trenches 430. The patterned mask layer 440 is removed after this step.

Figure 4C:
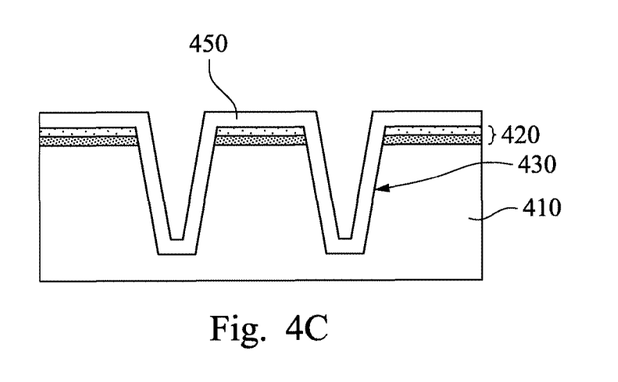

Referring to FIG. 4C, a bottom shallow trench isolation dielectric 450 is filled in the trenches 430. The bottom shallow trench isolation dielectric 450 is made of, for example, oxide. The bottom shallow trench isolation dielectric 450 is deposited in the trenches 430 and does not completely fill the trenches 430 or cover the pad layer 420. The bottom shallow trench isolation dielectric 450 is utilized to lower the aspect ratio by filling the bottom of the trenches 430. The bottom shallow trench isolation dielectric 450 is formed by a high density plasma chemical vapor deposition process (HDP-CVD), which is able to execute the depositing and sputtering process in the meantime, to prevent the production of voids due to its good ability in filling the gap. The HDP-CVD ions have a deposition component and a sputter component, such that the deposition and sputter-back step are performed in-situ, at one single process chamber as one step in the HDP-CVD process. In some embodiments, the initial aspect ratio of the trenches 430 is about 10, however, the aspect ratio is lowered to about 3 after the bottom shallow trench isolation dielectric 450 is deposited in the trenches 430. The deposition to sputter ratio can be adjusted by varying the process controlling parameter for achieving desired filling performance.

Figure 4D:
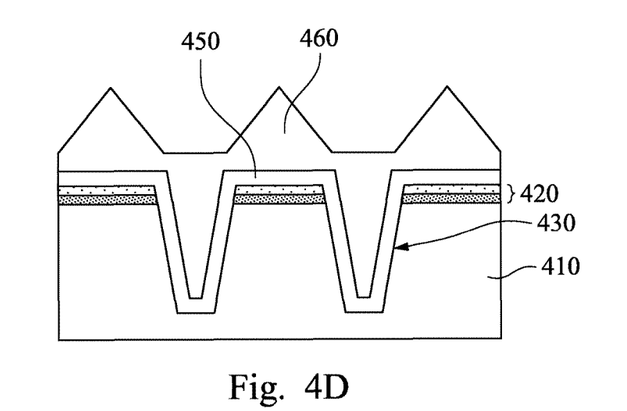

Referring to FIG. 4D, the top shallow trench isolation dielectric 460 is deposited on the bottom shallow trench isolation dielectric 450. The top shallow trench isolation dielectric 460 is formed by the HDP-CVD process. The deposition to sputter ratio for forming the top shallow trench isolation dielectric 460 is higher than that of forming the bottom shallow trench isolation dielectric 460. Comparing with forming the bottom shallow trench isolation dielectric 450, the top shallow trench isolation dielectric 460 is formed at a high deposition rate since the aspect ratio is reduced by depositing the bottom shallow trench isolation dielectric 450 in the trenches 430. The trenches 430 are filled by both the bottom shallow trench isolation dielectric 450 and the top shallow trench isolation dielectric 460 after the top shallow trench isolation dielectric is deposited on the substrate 410. The top shallow trench isolation dielectric 460 not only fills the trenches 430, but also covers the top surface of the pad layer 420. Because the top shallow trench isolation dielectric 460 is deposited at a high deposition to sputter ratio, such that the top shallow trench isolation dielectric 460 has an inclined surface profile at the corner of the trenches 430. Namely, the cross-sectional profile of the top shallow trench isolation dielectric 460 has plural triangle protrusions next to the trenches 430.

Figure 4E:
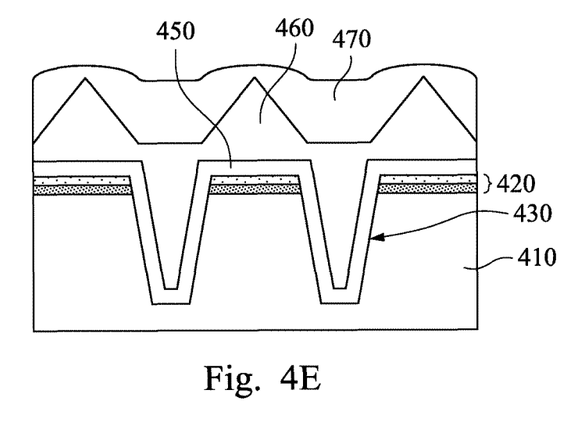

Referring to FIG. 4E, a cap film 470 is formed on the top shallow trench isolation dielectric 460. The cap layer 470 covers the top shallow trench isolation dielectric 460 and provides a top profile flatter than that of the top shallow trench isolation dielectric 460 having the triangle protrusion. In some embodiments, the bottom shallow trench isolation dielectric 450, the top shallow trench isolation dielectric 460, and the cap layer 470 are formed in the same process chamber. The ratio of the deposition reactants, the ratio of the deposition reactants to the sputter reactant, and the bias RF power can be adjusted corresponding to different deposition processes. Since the bottom shallow trench isolation dielectric 450 and the top shallow trench isolation dielectric 460 are formed by HDP-CVD processes with different deposition to sputter ratios and ratio of reactants, the bottom shallow trench isolation dielectric 450 and the top shallow trench isolation dielectric 460 have different index of reflectance. In some embodiments, the bottom shallow trench isolation dielectric 450 is a silicon-richer layer since the top shallow trench isolation dielectric 460 is an oxygen-richer layer, the index of reflectance of the top shallow trench isolation dielectric 460 is in a range from about 1.454 to about 1.456, and the index of reflectance of the bottom shallow trench isolation dielectric 450 is in a range from about 1.458 to about 1.460.

Figure 4F:
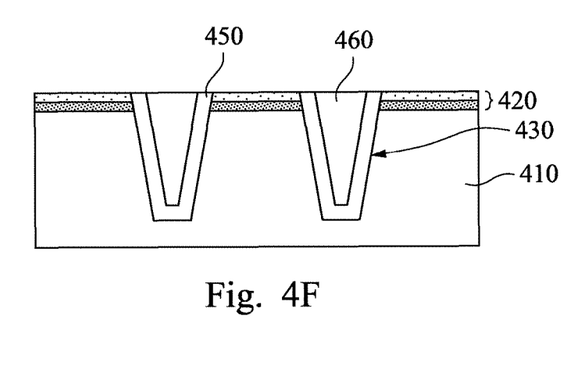

Referring to FIG. 4F, a planarization process is performed. The planarization process can be a chemical mechanical polishing (CMP) process. The substrate 410 is transferred to a CMP station for being polished. The substrate 410 is rinsed after being polished. Therefore, the surface of the substrate 410 is clean and planarized. The step of polishing the substrate 410 is stop at reaching the pad layer 120. Namely, the portions of the top shallow trench isolation dielectric 460 and the cap layer 470 over the pad layer 420 are removed.

Figure 4G:
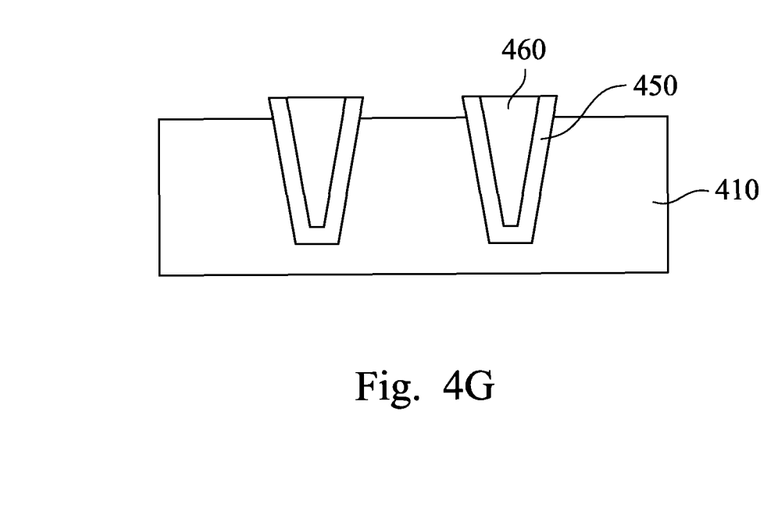

Referring to FIG. 4G, the remained pad layer 420 (see FIG. 4F) is removed from the substrate 410. The pad layer 420 can be removed by acidic component having high selectivity between the pad layer 420 and the substrate 410. The acidic component can include organic acid, such as benzenedicarboxylic acid, naphthalenedicarboxylic acid, benzenetricarboxylic acid, naphthalenetricarboxylic acid, pyridinedicarboxylic acid, bipyridyldicarboxylic acid, formic acid, oxalic acid, malonic acid, succinic acid, glutaric acid, hexanedioic acid, heptanedioic acid and cyclohexyldicarboxylic acid, etc. The acidic component can include inorganic acid, such as HF, HCl, HBr, HI, $HNO_3$, $H_3PO_4$, $H_2SO_4$, $HClO_4$, or a mixture thereof.

Therefore, the shallow trench isolations including the trench 430, the bottom shallow trench isolation dielectric 450 and the top shallow trench isolation dielectric 460 are formed in the substrate 410. The deposition to sputter ratio for forming the top shallow trench isolation dielectric 460 is higher than that of forming the bottom shallow trench isolation dielectric 450 since the aspect ratio is lowered by depositing the bottom shallow trench isolation dielectric 450 in the trenches 430. Such that the trenches 430 are filled rapidly without generating voids therein.

The present disclosure provides a method for fabricating a shallow trench isolation by two-step filling the gap of the trench. In some embodiments, the shallow trench isolation has a bottom shallow trench isolation dielectric filling the gap of the trench and a top shallow trench isolation dielectric deposited on the bottom shallow trench isolation dielectric for repairing the top profile of the shallow trench isolation. The top shallow trench isolation dielectric is formed by a low deposition to sputter ratio HDP-CVD process for obtaining a smooth surface. The thickness of the top shallow trench isolation dielectric is thinner than the depth of the trench, such that the fabricating time and throughput of the HDP-CVD process can be saved. In some embodiments, the bottom shallow trench isolation dielectric is utilized to lower the aspect ratio of the trench, such that the top shallow trench isolation dielectric is formed at a high deposition to sputter ratio HDP-CVD process.

Some embodiments of the present disclosure provide a method for fabricating a shallow trench isolation including forming a trench in a substrate, forming a bottom shallow trench isolation dielectric in the trench by a high density plasma chemical vapor deposition (HDP-CVD) process, and forming a top shallow trench isolation dielectric on the bottom shallow trench isolation dielectric by another HDP-CVD process with a different deposition to sputter ratio from that of the bottom shallow trench isolation dielectric.

Some embodiments of the present disclosure provide a method for fabricating a shallow trench isolation including forming a trench in a substrate, forming a bottom shallow trench isolation dielectric in the trench, forming a top shallow trench isolation dielectric on the bottom shallow trench isolation dielectric and on the substrate by a high density plasma chemical vapor deposition (HDP-CVD) process, and forming a mask layer on the top shallow trench isolation dielectric for patterning the top shallow trench isolation dielectric.

Some embodiments of the present disclosure provide a semiconductor structure including a substrate having a trench therein, a bottom shallow trench isolation dielectric formed in the trench, and a top shallow trench isolation dielectric formed on the bottom shallow trench isolation dielectric. The bottom shallow trench isolation dielectric and the top shallow trench isolation dielectric have different index of reflectance, in which the trench, the bottom shallow trench isolation dielectric and the top shallow trench isolation dielectric form a shallow trench isolation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a shallow trench isolation, comprising:
    forming a pad layer over a substrate;
    forming a trench in the substrate;
    forming a bottom shallow trench isolation dielectric in the trench and over the pad layer by a high density plasma chemical vapor deposition (HDP-CVD) process;
    forming a top shallow trench isolation dielectric over the bottom shallow trench isolation dielectric by another HDP-CVD process with a different deposition to sputter ratio from that of the bottom shallow trench isolation dielectric, wherein the top shallow trench isolation dielectric has a protrusion protruding away from the pad layer; and
    forming a cap layer over the top shallow trench isolation dielectric, wherein the cap layer has a portion over the protrusion of the top shallow trench isolation dielectric, and a top surface of the portion of the cap layer is flatter than a top surface of the protrusion of the top shallow trench isolation dielectric.

2. The method for fabricating the shallow trench isolation of claim 1, wherein a deposition to sputter ratio of the HDP-CVD process for forming the top shallow trench isolation dielectric is in a range from about 1.2 to about 3.

3. The method for fabricating the shallow trench isolation of claim 2, wherein the bottom shallow trench isolation dielectric is made of $Si_xO_y$, in which x>y.

4. The method for fabricating the shallow trench isolation of claim 2, wherein the top shallow trench isolation dielectric is made of $Si_xO_y$, in which x<y.

5. The method for fabricating the shallow trench isolation of claim 1, wherein the bottom shallow trench isolation dielectric is deposited at a bottom of the trench to lower an aspect ratio of the trench.

6. The method for fabricating the shallow trench isolation of claim 5, wherein the deposition to sputter ratio of forming the top shallow trench isolation dielectric is higher than that of forming the bottom shallow trench isolation dielectric.

7. The method for fabricating the shallow trench isolation of claim 1, further comprising planarizing the cap layer and the top shallow trench isolation dielectric.

8. The method for fabricating the shallow trench isolation of claim 1, wherein the bottom shallow trench isolation dielectric and the top shallow trench isolation dielectric have different indexes of reflectance.

9. The method for fabricating the shallow trench isolation of claim 1, wherein the protrusion is over the pad layer.

10. The method for fabricating the shallow trench isolation of claim 1, wherein the top shallow trench isolation dielectric and the cap layer are formed in the same process chamber.

11. A method for fabricating a shallow trench isolation, comprising:
    forming a first trench and a second trench in a substrate;
    forming a pad layer on the substrate before the first and second trenches are formed;
    forming first and second bottom shallow trench isolation dielectrics respectively in the first and second trenches;
    forming a top shallow trench isolation dielectric on the first and second bottom shallow trench isolation dielectrics and on the pad layer by a high density plasma chemical vapor deposition (HDP-CVD) process;
    forming a mask layer on the top shallow trench isolation dielectric for patterning the top shallow trench isolation dielectric;
    etching the top shallow trench isolation dielectric exposed by the mask layer until reaching the pad layer, wherein after the etching, a portion of the top shallow trench isolation dielectric on the pad layer continuously extends at least from the first trench to the second trench;
    removing the mask layer; and
    removing the portion of the top shallow trench isolation dielectric on the pad layer by a chemical mechanical polishing process.

12. The method for fabricating the shallow trench isolation of claim 11, wherein a deposition to sputter ratio of the HDP-CVD process is in a range from about 1.2 to about 3.

13. The method for fabricating the shallow trench isolation of claim 11, wherein deposition gasses utilized in the HDP-CVD process comprise silane ($SiH_4$) and oxygen, and sputter gas utilized in the HDP-CVD process comprises argon, oxygen, or hydrogen.

14. The method for fabricating the shallow trench isolation of claim 11, further comprising removing the pad layer.

15. The method for fabricating the shallow trench isolation of claim 11, wherein the first bottom shallow trench isolation dielectric has a concave surface, and the top shallow trench isolation dielectric is formed on the concave surface.

16. A semiconductor structure, comprising:
    a substrate having a trench therein;
    a bottom shallow trench isolation dielectric formed in the trench, wherein the bottom shallow trench isolation dielectric is made of $Si_xO_y$, in which $x>y$; and
    a top shallow trench isolation dielectric formed on the bottom shallow trench isolation dielectric, wherein an index of reflectance of the bottom shallow trench isolation dielectric is different from an index of reflectance of the top shallow trench isolation dielectric, wherein the trench, the bottom shallow trench isolation dielectric, and the top shallow trench isolation dielectric form a shallow trench isolation.

17. The semiconductor structure of claim 16, wherein the bottom shallow trench isolation dielectric has a concave surface, and the top shallow trench isolation dielectric is formed on the concave surface of the bottom shallow trench isolation dielectric.

18. The semiconductor structure of claim 16, wherein the index of reflectance of the top shallow trench isolation dielectric is in a range from about 1.454 to about 1.456, and the index of reflectance of the bottom shallow trench isolation dielectric is in a range from about 1.458 to about 1.460.

19. The semiconductor structure of claim 16, wherein the top shallow trench isolation dielectric is made of $Si_xO_y$, in which $x<y$.

20. The semiconductor structure of claim 16, wherein the index of reflectance of the bottom shallow trench isolation dielectric is greater than the index of reflectance of the top shallow trench isolation dielectric.

* * * * *